United States Patent [19]
Watanabe

[11] 3,942,005
[45] Mar. 2, 1976

[54] ELECTRON SCANNING APPARATUS
[75] Inventor: Tadao Watanabe, Katsuta, Japan
[73] Assignee: Hitachi, Ltd., Japan
[22] Filed: Dec. 12, 1974
[21] Appl. No.: 532,178

[52] U.S. Cl. .............................. 250/310; 250/311
[51] Int. Cl.² G01N 23/00; G21K 7/00; H01K 37/26
[58] Field of Search ............................ 250/311, 310

[56] References Cited
UNITED STATES PATENTS
| | | | |
|---|---|---|---|
| 2,354,263 | 7/1944 | Hillier | 250/311 |
| 3,786,271 | 1/1974 | Joy et al. | 250/311 |
| 3,878,392 | 4/1975 | Yew et al. | 250/310 |

Primary Examiner—James W. Lawrence
Assistant Examiner—T. N. Grigsby
Attorney, Agent, or Firm—Craig & Antonelli

[57] ABSTRACT

An electron scanning apparatus is capable of two-dimensional scanning of a specimen with a primary electron beam and also capable of radiating the primary electron beam in spot on the specimen. While moving the specimen in a straight line, the two-dimensional scanning with the primary electron beam is selectively alternated with the spot radiation with the primary electron beam, thus making it possible to identify the point of analysis on the specimen in the course of linear analysis of the specimen.

4 Claims, 2 Drawing Figures

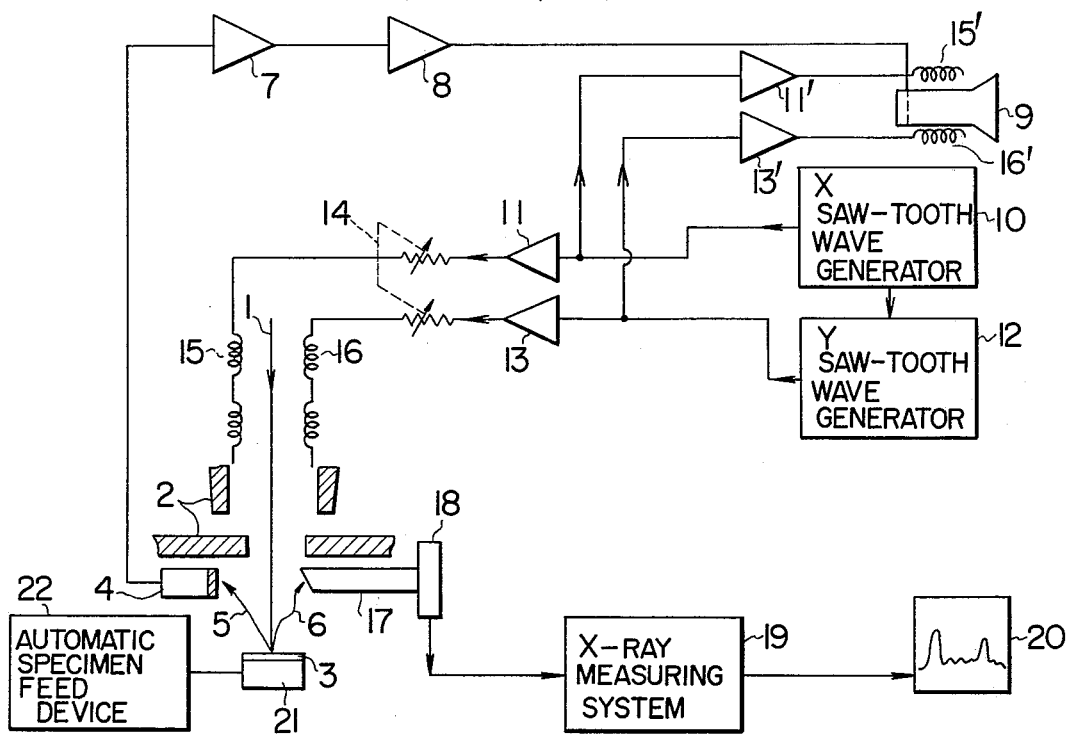
FIG. I PRIOR ART
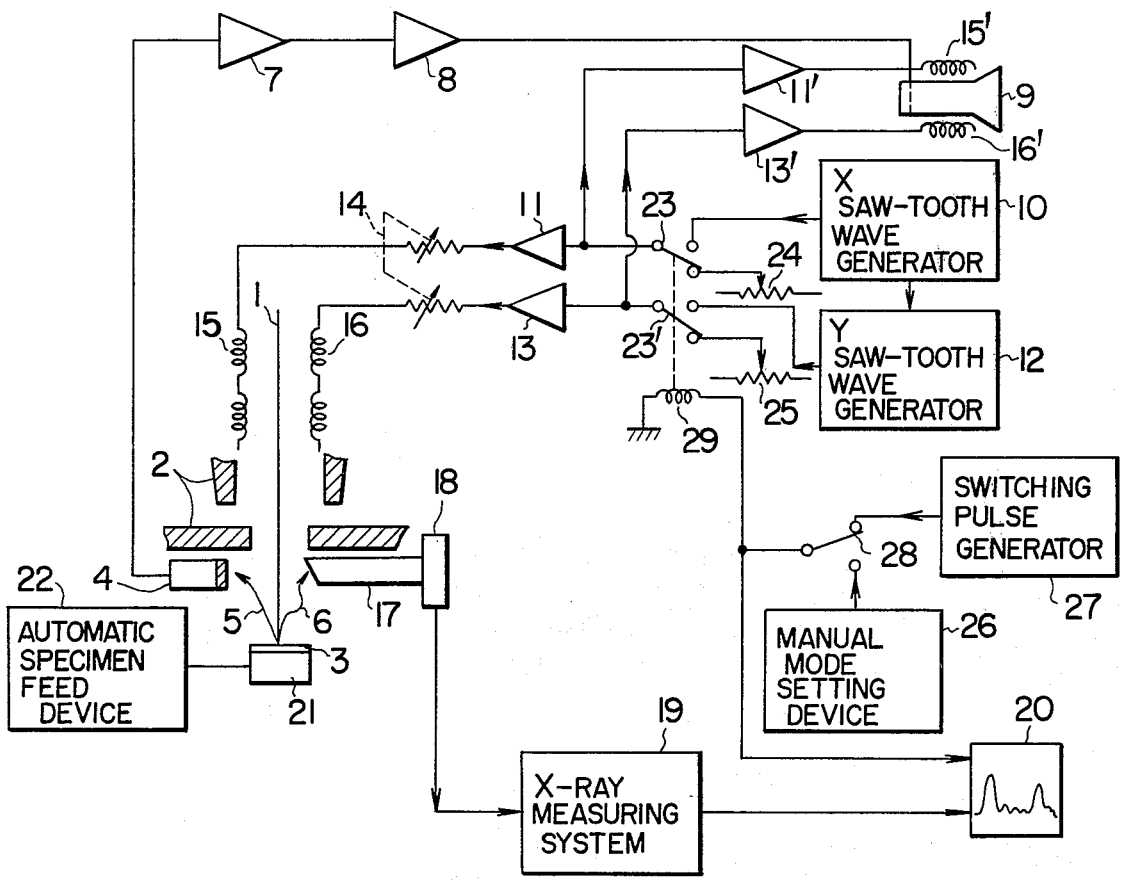
FIG. 2

ELECTRON SCANNING APPARATUS

BACKGROUND OF THE INVENTION

1. Field of the Invention

This invention relates to an electron scanning apparatus suitable for line analysis of specimens.

2. Description of the Prior Art

Recently, with the progress of the techniques for electronic applications, methods of analyzing a great variety of specimens are being established, a typical one of which is the line analysis technique described below.

Generally, the purpose of line analysis of a specimen is to analyze the component elements of the specimen in a given straight line on the specimen by the use of an electron scanning apparatus, for example, a scanning electron microscope equipped with an X-ray detector or an X-ray analytical instrument. There are three modes of analysis of the surface of a specimen including the plane analysis, spot analysis and line analysis. The plane analysis is for analyzing the two-dimension distribution of the elements in the surface of the specimen and has the disadvantage of a low S/N ratio. The spot analysis is concerned with the analysis of the component elements at a given point of the specimen surface and suitable for qualitative as well as quantitative analysis due to its high S/N ratio, even though it has the disadvantage that the analysis of the specimen surface is limited to a point. The line analysis, as mentioned already, is the process for analyzing the elements contained in a given straight line in the surface of the specimen and constitutes a sufficiently effective method of analysis to compensate for the disadvantages of the preceding two methods.

In X-ray analysis of a specimen, a finely focused primary electron beam is radiated on the surface of the specimen and an X-ray emitted from the radiated part of the surface of the specimen is detected by an X-ray detector. There are two methods of line analysis, mechanical and electrical. The mechanical method is one in which the radiating position of the primary electron beam is fixed while moving the specimen mechanically. In actual practice, a specimen-inching device driven by a motor or the like is used to feed the specimen in the direction of X or Y axis. The electrical method of line analysis, by contrast, consists in fixing the specimen while changing the position of the primary electron beam radiation on the surface of the specimen by linear deflection of the primary electron beam.

These methods have both advantages and disadvantages and which method is to be used is depending on the kind of specimen to be observed and the object of analysis. In the former method, that is, the mechanical method, a long linear section on the surface of the specimen is capable of being subjected to line analysis (for example, about 5 mm in an embodiment), but the movable parts of its specimen-inching device require a very high mechanical precision. On the other hand, the latter method is suitable for the case in which the line to be analyzed is not so long as in the former method, for example, the case where the length of about 0.5 mm is involved, due to the fact that changes in the radiating position of the primary electron beam causes variations in spectral conditions of the X ray. This method has the disadvantage that the result of analysis is often adversely affected by the drift of the primary electron beam, mechanical displacement of the specimen and charged condition of the specimen.

Prior to describing the present invention relating to an improvement of the former method, some problems which are encountered in the conventional method of line analysis will be described. There are two types of instruments capable of X-ray analysis of a specimen. One is the X-ray analytical instrument exclusively used for X-ray analysis of the specimen, and the other is a scanning electron microscope for observing an enlarged image of the specimen and which is equipped with an X-ray detector. Both of the above-mentioned instruments are equipped with an optical microscope either fixedly or removably. The optical microscope is provided for the purpose of determination of the point to be subjected to line analysis or observing, during the process of line analysis, the point being analyzed.

On the other hand, these apparatus are provided with such a display unit as a cathode ray tube, in addition to the optical microscope, for displaying a secondary electron image, that is, an enlarged image of the surface of the specimen. The line analysis, therefore, inevitably depends on such an optical microscope for the determination of the position of the specimen surface to be analyzed and for identification of such a position during the analytical operation. However, in the case of a scanning electron microscope equipped with an optical microscope replaceably, for example, it is necessary to reequip the electron microscope with the optical microscope if the position of analysis of the specimen is to be identified during the analytical operation. There are even some apparatuses incapable of identifying the position of analysis as it is impossible to equip it with the optical microscope in the course of analysis. Especially, a scanning electron microscope, which is capable of observation and X-ray line analysis of the surface structure of a specimen at the same time, requires no separate X-ray analytical instrument exclusively used for X-ray analysis, resulting in a great saving of analysis time. Partly due to this fact, a demand has always existed for development of a novel apparatus capable of observation and identification of the position of analysis during the X-ray analysis without any optical microscope having an only purpose of determining the position of analysis on the specimen.

SUMMARY OF THE INVENTION

Accordingly, it is an object of the present invention to provide an electron scanning apparatus capable of reduction in analysis time.

Another object of the invention is to provide a low-cost electron scanning apparatus applicable in wide fields of analysis.

Still another object of the invention is to provide an electron scanning apparatus which eliminates the need for the optical microscope.

In the electron scanning apparatus according to a preferred embodiment of the invention, the parimary electron beam is capable of two-dimensionally scanning the specimen on one hand and of radiating in a fixed spot thereon on the other hand. In addition, the invention is characterized in that the electron scanning apparatus is adapted to alternate between the two-dimensional scanning of the primary electron beam and the spot radiation on the specimen.

BRIEF DESCRIPTION OF THE DRAWING

FIG. 1 is a block diagram showing a conventional scanning electron microscope.

FIG. 2 is a block diagram showing an embodiment of the present invention applied to a scanning electron microscope.

DESCRIPTION OF THE PREFERRED EMBODIMENT

Prior to entering the description of the embodiment of the invention, explanation will be made of the operating principle and construction of a conventional scanning electron microscope capable of line analysis with reference to a scanning electron microscope in wide use.

Referring to FIG. 1 showing the construction of the conventional scanning electron microscope, a finely focused primary electron beam 1 is radiated on the specimen 3 through an objective lens 2. The primary electron beam 1 produced from an electron gun not shown scans two-dimensionally the specimen 3 by being deflected in two directions by the X deflection coil 15 and the Y deflection coil 16. The specimen 3 thus bombarded with the primary electron beam 1 emits secondary electrons 5, which in turn are detected and converted into electrical signals by a secondary electron detector 4. The electrical signal produced from the detector 4 is amplified by the preamplifier 7 and main amplifier 8 and applied to the grid of the cathod ray tube 9.

On the other hand, the output of the X saw-tooth wave generator 10 is applied to the two X deflection amplifiers 11 and 11'. The output from the amplifier 11 is applied through the magnetication varying device 14 to the X deflection coil 15 of the scanning electron microscope, whereas the output of the amplifier 11' is applied directly to the X deflection coil 15' of the cathode ray tube 9. The output of the Y saw-tooth wave generator 12, like that of the X saw-tooth wave generator 10, is applied through the two Y deflection amplifiers 13 and 13' respectively to the Y deflection coil 16 of the scanning electron microscope and to the Y deflection coil 16' of the cathode ray tube 9.

In the above-described construction of the scanning electron microscope, the signals produced from the X and Y saw-tooth wave generators 10 and 11 are used to two-dimensionally scan the surface of the specimen 3 in a range corresponding to the value set by the magnification varying device 14. At the same time, the scanning signal in synchronism with the scanning rate is applied to the cathode ray tube 9, thus enabling a magnified image of the specimen 3 to be displayed on the fluorescent viewing screen of the cathode ray tube 9.

In the case where line analysis is effected by the use of the above-mentioned apparatus, an X-ray detector 17 is provided in addition to the primary electron detector, as shown in FIG. 1. The X-ray detected by the X-ray detector 17 is applied through the preamplifier 18 to the X-ray measuring system 19, where it is converted into an electrical signal and applied to the recorder 20. The output of the X-ray measuring system 19 may be applied to the grid of the cathode ray tube 9 for display of an X-ray image instead of the recorder 20 as shown. The specimen 3 is disposed on the specimen support 21 connected to the automatic specimen feed device 22 for linear movement of the specimen. The automatic specimen feed device 22 may alternatively be coupled to the X- or Y-axis inching shaft of the inching device.

When the primary electron beam in spot form is radiated on the specimen 3 while rectilinearly moving the specimen by driving the automatic specimen feed device 22, the primary electron beam is radiated rectilinearly on the surface of the specimen 3. Under this analytical condition, however, it is impossible to identify the position where the analysis is being conducted on the surface of the specimen 3. In order to overcome this problem, the objects of the invention are easily achieved by adding the component elements denoted by reference numerals 23 to 29 in FIG. 2.

In other words, the apparatus shown in FIG. 2 is an embodiment of the invention as applied to the conventional apparatus of FIG. 1. Like reference numerals in FIG. 2 show like component elements having like reference numerals in FIG. 1, and the processes for image display and line analysis will not be described as they have similar functions.

In FIG. 2, reference numeral 26 shows a manual mode setting device, numeral 27 a switching pulse generator, and numeral 29 a relay. The relay 29 has a couple of contacts 23 and 23', of which the contact 23 is provided to switch a power supply between the X saw-tooth wave generator 10 and the X bias source 24 for supplying a signal to the X deflection coils of the scanning electron microscope and the cathode ray tube 9. The other contact 23', by contrast, is provided for the purpose of switching a power source between the Y saw-tooth wave generator 12 and the Y bias source 25 for supplying a signal to the Y deflection coils of the scanning electron microscope and the cathode ray tube 9. The relay 29 is adapted to be energized in response to the output signal from the manual mode setting device 26 or the switching pulse generator 27 through the automanual change-over switch 28.

The actual operation of line analysis performed by the apparatus with the above-described construction will be explained. Assume that the change-over switch 28 is closed to manual side, that is, to the manual mode setting device 26. First, the primary electron beam 1 focused to the order to several thousands angstroms by the objective lens 2 is radiated on the surface of the specimen 3. Since the contacts 23 and 23' of the relay 29 are previously switched to the side of the X bias source 24 and Y bias source 25 respectively, the position of the spot of the primary electron beam radiated on the specimen 3 is determined by the X bias source 24 and Y bias source 25. Under this condition, the automatic specimen feed device 22 is driven, whereupon the analysis point on the surface of the specimen steadily changes so as to rectilinearly analyze the surface of the specimen. In this connection, the position of the spot image displayed on the cathode ray tube 9 by the radiation of the primary electron beam on the specimen 3 is required to be adjusted in advance to be located at the center of the viewing screen. In other words, the center of an enlarged image displayed on the cathode ray tube must be in agreement with the position of the spot of the primary electron beam radiated on the specimen surface for line analysis.

In the event that the identification of the point of analysis on the surface of the specimen is desired in the course of line analysis, the manual mode setting device 26 may be effectively used. The pulse signal generated by the operation of the manual mode setting device 26 causes the relay 29 to be energized. The contacts 23 and 23' of the relay 29 are switched to the X saw-tooth wave generator 10 and the Y saw-tooth wave generator 12 respectively. In the energized state of the relay 29, the primary electron beam 1 which has thus far been spot-radiated on the surface of the specimen 3 scans two-dimensionally the surface of the specimen 3. As a result, the center of the image displayed on the viewing screen of the cathode ray tube always indicates the point being subjected to line analysis, thus facilitating the identification of the point of analysis.

Of course, an image enlarged in any desired magnification may be displayed on the screen of the cathode ray tube by operating the magnification varying device 14 in the course of line analysis. Further, in the energized state of the relay 29, that is, as long as an enlarged image of the specimen 3 is displayed on the cathode ray tube 9, the line analysis may be suspended by raising the pen of the recorder 20 by the use of the signal produced from the relay 29.

Also, the present invention is such that the point of analysis on the surface of the specimen 3 can be identified by scanning the primary electron beam 1 on the specimen 3 at regular intervals of time and by displaying an image of the specimen 3 on the cathode ray tube 9 during the line analytical operation. For this purpose, the change-over switch 28 is closed to auto side thereby to energize the switching pulse generator 27 connected to the switch 28. The output pulses from the switching pulse generator 27, which are produced at regular periods of time, energize the relay 29, whereupon the contacts 23 and 23' of the relay are switched, so that the point of analysis is displayed at the center of the image on the screen of the cathode ray tube at regular intervals of time through the same processes as those mentioned already. In this case, too, as long as the point of analysis is displayed on the screen of the cathode ray tube, that is, during the temporary suspension of the line analysis, the pen of the recorder may be raised by applying the output of the switching pulse generator 27 to the recorder through the change-over switch 28 as shown in FIG. 2.

The above-mentioned suspension time of about 0.5 to 1 second will suffice as the cathode ray tube employed exhibits the property of afterglow. This length of suspension time poses no significant problem in view of the fact that the feed rate of the specimen 3 for line analysis is generally of the order of 20 to 100 $\mu$/min or 2 to 5 $\mu$/min at the slowest, resulting in only a minute portion of the surface of the specimen being substantially affected by the suspension of line analysis.

According to the above-mentioned configuration of the invention, it is possible to identify the ever-changing analytical position of the specimen on the viewing screen of the cathode ray tube while observing the data on line analysis on the recording paper, thus facilitating a collating of the analytical data with the analytical position. This collating operation may be conducted either by hand or automatically, as mentioned earlier. Unlike the conventional method of identifying the analytical point by the use of the optical microscope in which the mechanical adjustment for coincidence between the optical axis and the electron beam axis requires a very high skill, the adjustment according to the present invention is easily achieved by merely adjusting the bias power source in such a manner that the spot displayed on the cathode ray tube comes in agreement with the center of the viewing screen of the cathode ray tube, thereby eliminating the need of the optical microscope and hence the need for mechanical registration of the axes.

Further, in the conventional method, it is impossible to vary the magnification of the optical microscope for observing the point of analysis in the surface of the specimen during the analytical operation, since, if varied, the optical axis changes greatly. According to the present invention employing no optical microscope, by contrast, the magnification can be changed even in the course of analysis. In addition, the great advantage of the invention is that an image of the point of analysis can be observed at the great depth of focus as in the case of image observation on an ordinary scanning electron microscope.

It will thus be seen that the objects set forth above, among those apparent from the preceding description, are efficiently attained, and since certain changes may be made in the above construction without departing from the spirit and scope of the invention, it is intended that all matter contained in the above description or shown in the accompanying drawings shall be interpreted as illustrative and not in a limiting sense.

I claim:

1. An electron scanning apparatus comprising scanning means for two-dimensionally scanning a specimen with a primary electron beam, means for radiating the surface of said specimen with said primary electron beam in the form of spot, a couple of detector means for detecting information generated from said specimen by said scanning means and said radiating means, display and recording means for displaying and recording said information in response to the output signal from said detector means, and first switching means for selectively alternating between said scanning means and said radiating means.

2. An electron scanning apparatus according to claim 1, further comprising a manual mode setting device for manually issuing a switching command to said first switching means.

3. An electron scanning apparatus according to claim 1, further comprising a switching pulse generator for issuing a switching command to said first switching means repeatedly at regular intervals of time.

4. An electron scanning apparatus according to claim 2, further comprising a switching pulse generator for issuing a switching command to said first switching means repeatedly at regular intervals of time, and second switching means for selecting at will the signals from said manual mode setting device or those from said switching pulse generator.

* * * * *